(12) United States Patent
Goncalves-Da-Costa et al.

(10) Patent No.: US 12,446,197 B2
(45) Date of Patent: Oct. 14, 2025

(54) VOLTAGE CONVERTER AND METHOD FOR MANUFACTURING A VOLTAGE CONVERTER

(71) Applicant: Valeo Equipements Electriques Moteur, Creteil (FR)

(72) Inventors: Ricardo Goncalves-Da-Costa, Creteil (FR); Manuel Falguier, Creteil (FR); Romain Henneguet, Creteil (FR); Christophe Avel, Creteil (FR); Théo Rodier, Creteil (FR); Fabien Guerin, Chennai (IN); Gowardanan Chinnathambi, Chennai (IN)

(73) Assignee: Valeo Equipements Electriques Moteur, Creteil (FR)

( * ) Notice: Subject to any disclaimer, the term of this patent is extended or adjusted under 35 U.S.C. 154(b) by 233 days.

(21) Appl. No.: 17/312,636

(22) PCT Filed: Dec. 11, 2019

(86) PCT No.: PCT/EP2019/084690
§ 371 (c)(1),
(2) Date: Jun. 10, 2021

(87) PCT Pub. No.: WO2020/120594
PCT Pub. Date: Jun. 18, 2020

(65) Prior Publication Data
US 2022/0078939 A1 Mar. 10, 2022

(30) Foreign Application Priority Data
Dec. 11, 2018 (FR) ........................ 1872669

(51) Int. Cl.
*H05K 7/20* (2006.01)
*H05K 1/02* (2006.01)
*H02M 7/00* (2006.01)

(52) U.S. Cl.
CPC ........... *H05K 7/209* (2013.01); *H05K 1/0203* (2013.01); *H05K 7/2049* (2013.01); *H02M 7/003* (2013.01);
(Continued)

(58) Field of Classification Search
CPC ....... H01L 2924/00012; H01L 23/4006; H01L 2924/00014; H01L 23/3735;
(Continued)

(56) References Cited

U.S. PATENT DOCUMENTS

| 5,450,284 A * | 9/1995 | Wekell ................ H01L 23/4006 257/725 |
| 2002/0162039 A1* | 10/2002 | Kirker ........................ G06F 1/26 713/300 |

(Continued)

FOREIGN PATENT DOCUMENTS

| EP | 2876983 A2 | 5/2015 |
| FR | 2979961 A1 | 3/2013 |
| WO | 2017/126315 A1 | 7/2017 |

OTHER PUBLICATIONS

International Search Report and Written Opinion in corresponding International Application No. PCT/EP2019/084690, mailed Feb. 21, 2020 (10 pages).

*Primary Examiner* — Mandeep S Buttar
(74) *Attorney, Agent, or Firm* — Osha Bergman Watanabe & Burton LLP

(57) ABSTRACT

The voltage converter (104) comprises:—a power module (110) comprising at least one controllable switch intended to switch in order to perform a voltage conversion;—a heat sink (206) having an upper face opposite a lower face of the power module (110) for dissipating heat emitted by the power module (110); and—at least one resilient element (308) bearing on an upper face of the power module (110) in order to hold the power module (110) in place relative to the heat sink (206).

(Continued)

Each resilient element (308) is rigidly connected to the heat sink (206).

10 Claims, 3 Drawing Sheets

(52) U.S. Cl.
CPC ............... *H05K 2201/066* (2013.01); *H05K 2201/10984* (2013.01)

(58) Field of Classification Search
CPC ............ H01L 2023/405; H01L 23/367; H01L 23/4093; H05K 7/209; H05K 7/1432; H05K 1/0203; H05K 2201/066; H05K 3/0061
USPC ........................................................ 361/704
See application file for complete search history.

(56) References Cited

U.S. PATENT DOCUMENTS

| 2005/0135065 A1* | 6/2005 | Nakatsu ................. H01L 25/115 257/E25.026 |
| 2005/0264998 A1* | 12/2005 | McCutcheon ...... H01L 23/4006 257/E23.084 |
| 2015/0146380 A1* | 5/2015 | Lu ....................... H05K 7/14322 361/709 |
| 2021/0335692 A1* | 10/2021 | Ji ........................ H05K 7/20445 |
| 2022/0392824 A1* | 12/2022 | Wada ................. H01L 23/3672 |

* cited by examiner

VOLTAGE CONVERTER AND METHOD FOR MANUFACTURING A VOLTAGE CONVERTER

The present invention relates to a voltage converter and to a method for manufacturing a voltage converter.

The prior art discloses a voltage converter comprising:—a power module comprising at least one controllable switch intended to switch in order to perform a voltage conversion;—a heat sink having an upper face opposite a lower face of the power module in order to dissipate heat emitted by the power module; and—at least one resilient element bearing on an upper face of the power module in order to hold the power module in place relative to the heat sink.

In the prior art, the resilient element is in the shape of a "W" and is placed on the upper face of the power module. At the end of the assembly of the voltage converter, in particular after thermal adhesive inserted between the lower face of the power module and the upper face of the heat sink has been crosslinked by heating, a cover is added to the heat sink and is attached thereto. The cover then bears on the resilient element in the shape of a "W" in order to flatten it, such that this resilient element in the shape of a "W" in return bears on the upper face of the power module in order to hold it in place relative to the heat sink.

One drawback of the prior art is that the resilient element needs to be held in place, in particular when the cover flattens it. Thus, the prior art provides, on the upper face of the heat sink, indexing pins that are intended to engage with indentations that are provided in the resilient element.

The aim of the invention is to at least partly solve the aforementioned problem.

To this end, a voltage converter is proposed comprising:—a power module comprising at least one controllable switch intended to switch in order to perform a voltage conversion;—a heat sink having an upper face opposite a lower face of the power module for dissipating heat emitted by the power module; and—at least one resilient element bearing on an upper face of the power module in order to hold the power module in place relative to the heat sink, characterized in that each resilient element is rigidly connected to the heat sink.

By virtue of the invention, means for indexing the resilient element relative to the heat sink are no longer needed.

Optionally, the voltage converter further comprises a printed circuit board for controlling the power module.

Also optionally, each resilient element is attached to a part covering the power module, said part being attached to the heat sink.

Also optionally, the printed circuit board extends above the part covering the power module and is attached to said part.

Also optionally, each resilient element is directly attached to the heat sink.

Also optionally, the heat sink comprises, for each resilient element, a support projecting upward from the upper face of the heat sink, said resilient element being attached to a top of said support.

Also optionally, the voltage converter comprises a plurality of power modules and a part having a plurality of resilient elements respectively bearing on the upper faces of the power modules in order to hold said power modules in place relative to the heat sink.

Also optionally, the voltage converter comprises a plurality of power modules and a plurality of parts each having one or more resilient elements, the resilient elements of said parts respectively bearing on the upper faces of the power modules in order to hold said power modules in place relative to the heat sink.

A method is also proposed for manufacturing a voltage converter, comprising placing a lower face of a power module comprising at least one controllable switch, which is designed to switch in order to perform a voltage conversion, opposite an upper face of a heat sink, which is designed to dissipate heat emitted by the power module, characterized in that it further comprises rigidly connecting at least one resilient element to the heat sink, so that the resilient element bears on an upper face of the power module in order to hold the power module in place relative to the heat sink.

Optionally, thermal adhesive is inserted between the lower face of the power module and the upper face of the heat sink, and the method further comprises, after rigidly connecting each resilient element to the heat sink, heating the voltage converter so as to crosslink the thermal adhesive.

Also optionally, the method further comprises, after heating the voltage converter so as to crosslink the thermal adhesive, attaching a printed circuit board for controlling the power module to the heat sink.

Also optionally, thermal adhesive is inserted between the lower face of the power module and the upper face of the heat sink, and the method further comprises:—heating the voltage converter so as to crosslink the thermal adhesive, and wherein the rigid connection of each resilient element to the heat sink is performed after the heating step.

Figure 1:
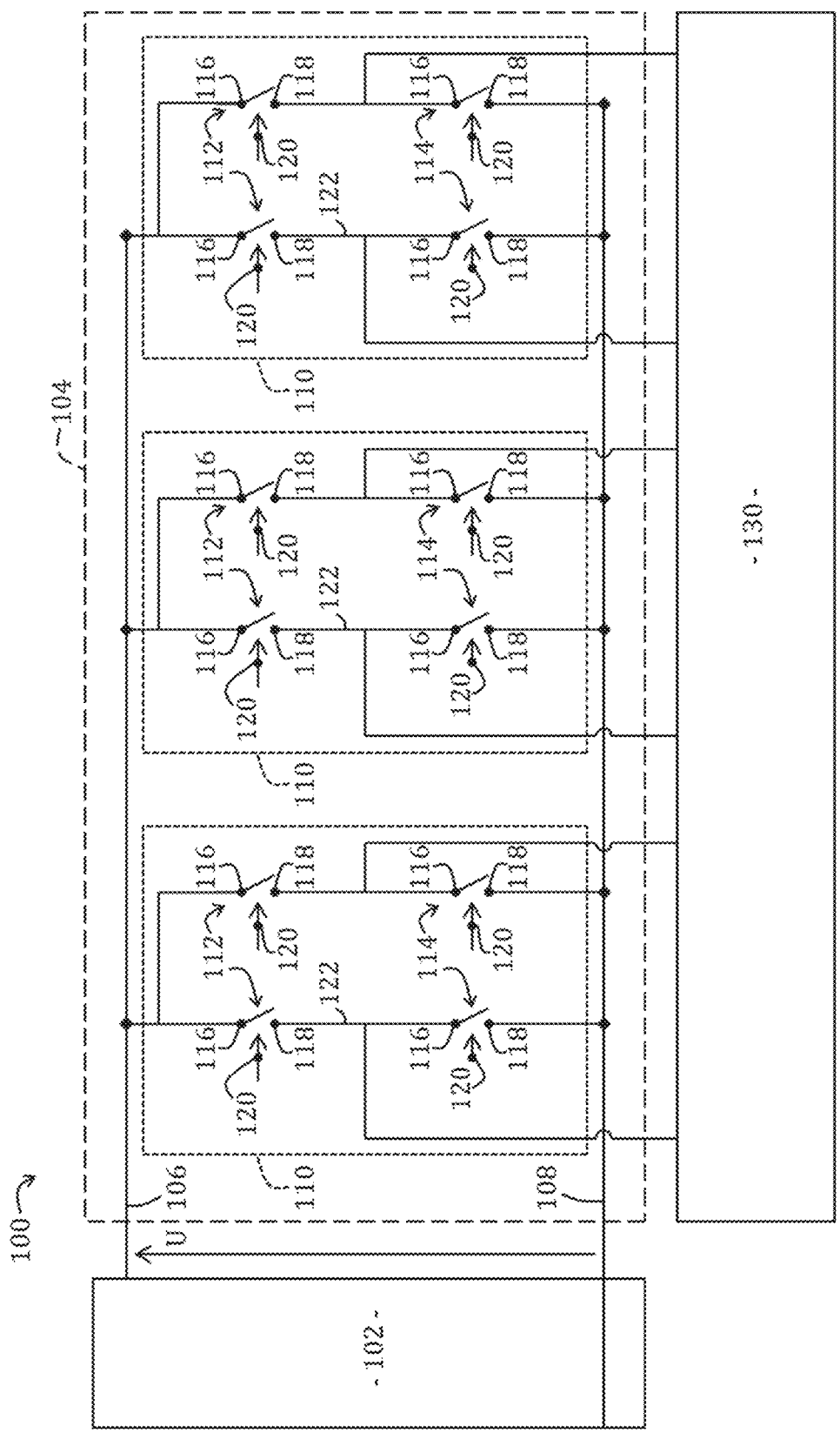
FIG. 1 is a circuit diagram of an electrical system implementing the invention.

An electrical system 100 implementing the invention will now be described with reference to FIG. 1.

The electrical system 100 is intended, for example, to be installed in a motor vehicle.

The electrical system 100 firstly comprises an electric power source 102 designed to deliver a direct voltage U, for example, ranging between 10 V and 100 V, for example, 48 V or else 12 V. The electric power source 102 comprises a battery, for example.

The electrical system 100 further comprises an electric machine 130 comprising a plurality of phases (not shown) that are intended to have respective phase voltages.

The electrical system 100 further comprises a voltage converter 104 connected between the electric power source 102 and the electric machine 130 in order to perform a conversion between the direct voltage U and the phase voltages.

The voltage converter 104 firstly comprises a positive busbar 106 and a negative busbar 108 intended to be connected to the electric power source 102 in order to receive the direct voltage U, with the positive busbar 106 receiving a high electric potential and the negative busbar 108 receiving a low electric potential.

The voltage converter 104 further comprises at least one power module 110 comprising portions of the positive 106 and negative 108 busbars, as well as one or more phase busbars 122 that are intended to be respectively connected to one or more phases of the electric machine 130 in order to provide their respective phase voltages.

In the described example, the voltage converter 104 comprises three power modules 110 each comprising two phase busbars 122 connected to two phases of the electric machine 130.

More specifically, in the described example, the electric machine 130 comprises two three-phase systems each comprising three phases and intended to be electrically phase-shifted from one another by 120°. Preferably, the first phase busbars 122 of the power modules 110 are respectively connected to the three phases of the first three-phase system, whereas the second phase busbars 122 of the power modules 110 are respectively connected to the three phases of the second three-phase system.

Each power module 110 comprises, for each phase busbar 122, a high-side switch 112 connected between the positive busbar 106 and the phase busbar 122, and a low-side switch 114 connected between the phase busbar 122 and the negative busbar 108. Thus, the switches 112, 114 are arranged so as to form a switching arm, in which the phase busbar 122 forms a center tap.

Each switch 112, 114 comprises first and second main terminals 116, 118 and a control terminal 120 intended to selectively open and close the switch 112, 114 between its two main terminals 116, 118 depending on a control signal that is applied thereto. The switches 112, 114 are preferably transistors, for example, Metal-Oxide Semiconductor Field-Effect Transistors (MOSFETs) having a gate forming the control terminal 120, and a drain and a source respectively forming the main terminals 116, 118.

Furthermore, in the described example, the electric machine 130 simultaneously has an alternator and an electric motor function. More specifically, the motor vehicle further comprises a heat engine (not shown) having an output shaft, to which the electric machine 130 is connected via a belt (not shown). The heat engine is intended to drive the wheels of the motor vehicle by means of its output shaft. Thus, during operation as an alternator, the electric machine supplies the electric power source 102 with electrical energy based on the rotation of the output shaft. The voltage converter 104 then operates as a rectifier. During operation as an electric motor, the electric machine drives the output shaft (in addition to or else instead of the heat engine). The voltage converter 104 then operates as an inverter.

The electric machine 130 is located, for example, in a gearbox or else in a clutch of the motor vehicle or else in place of the alternator.

Throughout the remainder of the description, the structure and the layout of the elements of the voltage converter 104 will be described in further detail, with reference to a random direction H-B taken as a vertical direction, with "H" representing the top and "B" representing the bottom.

Figure 2:
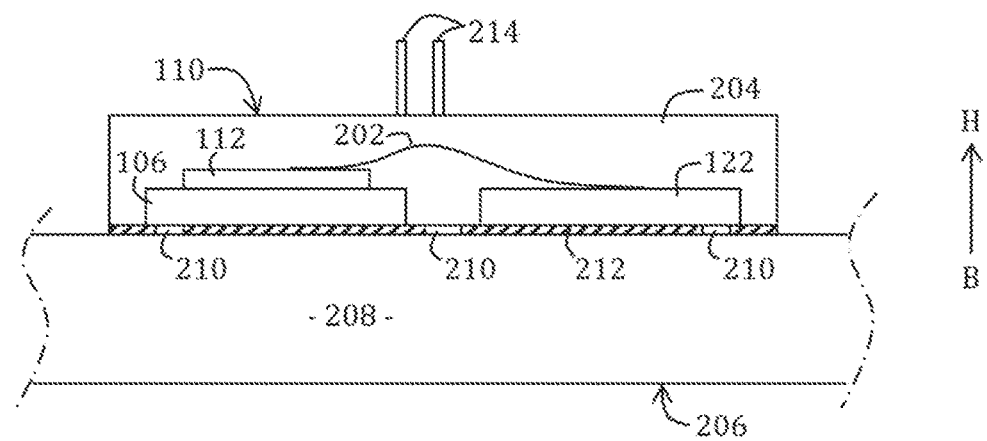
FIG. 2 is a section view of the arrangement of a power module and of a heat sink of the electrical system of FIG. 1.

With reference to FIG. 2, one of the power modules 110 will now be described in further detail, noting that the other power modules are similar.

In the power module 110, the busbars 106, 108, 122 (only the busbars 106, 122 are shown in FIG. 2) extend substantially horizontally.

Each switch 112, 114 (only one of the high-side switches 112 is shown in FIG. 2) has a general flat shape and is pressed against an upper face of one of the two busbars between which it is placed. The switch 112, 114 is also electrically connected to the other one of the two busbars between which it is placed, for example, by one or more electric strips 202.

The power module 110 further comprises a casing 204 covering the busbars 106, 108, 122, the switches 112, 114 and the electric strips 202. This casing 204 leaves the lower faces of the busbars 106, 108, 122 exposed, partly forming a lower face of the power module 110. The casing 204 is, for example, produced by overmolding the busbars 106, 108, 122, the switches 112, 114 and the conductive strips 202, for example, with a hard resin such as epoxy.

The voltage converter 104 further comprises a heat sink 206 designed to dissipate heat emitted by the power modules 110. The heat sink 206 can have fins (not shown) and/or a circuit for circulating a coolant, such as water (not shown).

In the described example, the heat sink 206 comprises a plate 208 that is substantially horizontal and has an upper face extending opposite the lower face of the power module 110, and in particular the exposed lower faces of the busbars 106, 108, 122.

One or more spacers 210 are present between the lower face of the power module 110 and the upper face of the heat sink 206. These spacers 210 allow a space to be provided between the upper face of the heat sink 206 and the lower faces of the busbars 106, 108, 122. This space provides the necessary electrical insulation due to the differences in potentials between the busbars 106, 108, 122 and the heat sink 206. Furthermore, this space allows any flatness defects of the lower faces of the busbars 106, 108, 122 and of the upper face of the heat sink 206 to be compensated. Preferably, this space is at most 200 µm in order to allow good heat exchange between the power module 110 and the heat sink 206.

Furthermore, in order to provide good heat conduction, the space is filled with a heat conducting material 212. However, in the described example, the hard resin is generally too fragile to support screws or rivets through the casing 204 for attaching said casing to the heat sink 206. Thus, preferably, the heat conducting material 212 comprises a thermal adhesive that is intended to provide, in addition to heat conduction, the at least partial attachment of the power module 110 to the heat sink 206, in order to hold the power module 110 near the heat sink 206, despite the vibrations and the ageing of the parts. Alternatively, the heat conducting material 212 could be a thermal paste, without an adhesion function, having the advantage of being cheaper than thermal adhesive.

The power module 110 further comprises pins 214 projecting upward and intended to be connected to a printed circuit board that will be described hereafter.

Figure 3:
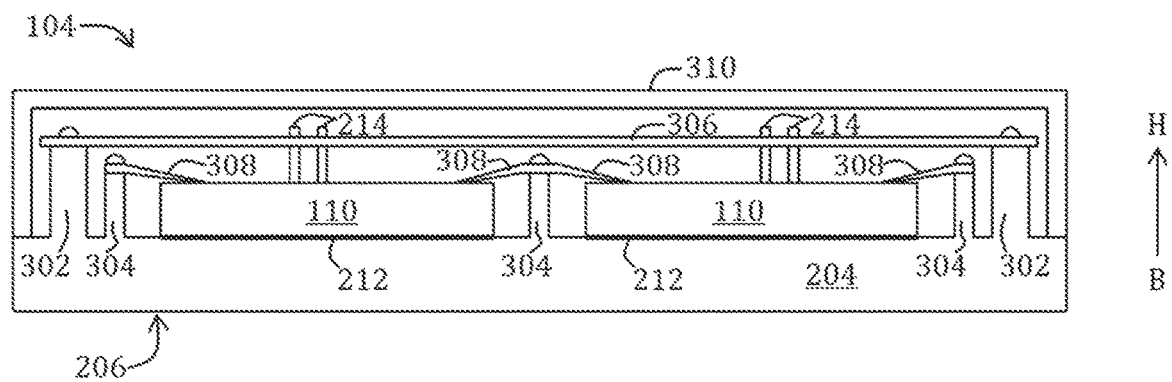
FIG. 3 is a section view of a voltage converter according to a first embodiment of the invention comprising the elements of FIG. 2.

With reference to FIG. 3, according to a first embodiment of the invention, the heat sink 206 further comprises first studs 302 and second studs 304 projecting upward from the upper face of the plate 208 of the heat sink 206, with the second studs 304 not being as high as the first studs 302. The studs 302, 304 are, for example, integrally formed with the plate 208 of the heat sink so as to form a single part with said plate.

The voltage converter 104 further comprises a printed circuit board 306 for controlling power modules 110. The printed circuit board 306 is attached to the top of the first studs 302 so as to substantially horizontally extend above the power modules 110. The pins 214 pass through the printed circuit board 306 and are connected thereto to allow the power modules 110 to be controlled.

The voltage converter 104 further comprises, for each power module 110, at least one resilient element 308 bearing on an upper face of said power module 110 in order to hold it in place relative to the heat sink 206. In the described example, each resilient element 308 is directly attached to the heat sink 206, more specifically to the top of one of the second studs 304 of the heat sink 206. Preferably, each resilient element 308 applies a force of more than 50 N, for example, ranging between 50 N and 100 N, on the associated power module 110. Furthermore, a force of more than 100 N, for example, ranging between 100 N and 200 N, is preferably applied on each power module 110 by one or more of the resilient elements 308. In the described example, two resilient elements 308 bear on each power module 110.

In the described example, the resilient elements 308 are made of metal and are in the form of a tab with a first free end bearing on one of the power modules 110 and a second end attached to the top of one of the second studs 304. In another embodiment, the resilient elements could have two ends attached, for example, to studs such as the second studs 304, so as not to have a free end. In this case, each resilient element would have a resilient central part, located between the two fixed ends, bearing on the associated power module 110.

In the described example, first parts are provided, each forming a single resilient element 308. Second parts are also provided, each forming a pair of resilient elements 308, respectively bearing on two different power modules 110.

The resilient elements 308 allow the power modules 110 to be held in place relative to the heat sink 206, even when the thermal adhesive deteriorates due to ageing, which could lead to the detachment of the power modules 110 and thus to the at least partial thermal uncoupling of the power modules 110 relative to the heat sink 206, risking damage to the power modules 110.

When thermal paste is used as a heat conducting material 212, resilient elements 308 simply can be used to hold the power modules 110 against the heat sink 206. In this case, for each power module 110, a means can be provided for horizontally positioning this power module 110 relative to the heat sink 206, in order to prevent the power module 110 from sliding horizontally relative to the heat sink 206, while the resilient elements 308 press against it vertically.

Furthermore, the voltage converter 104 preferably comprises means for preventing the resilient elements 308 from sliding on the upper faces of the power modules 110, in particular for preventing a rotation of the resilient elements 308 when said elements are attached by means of screws, as in the described example. These means comprise, for example, for each resilient element 308, stops provided on the upper face of the associated power module 110. These stops are produced, for example, by ribs provided on the upper face of the power module 110.

It will be appreciated that the resilient elements 308 are attached to the heat sink 206 independently of the printed circuit board 306, which allows the resilient elements 308 to be attached so that they hold the power modules 110 in place, while the printed circuit board 306 is not yet attached. Thus, as will be explained hereafter, it is possible to use the resilient elements 308 to hold the power modules 110 in place while the thermal adhesive 212 is being heated for the crosslinking thereof, before attaching the printed circuit board 306, which would be at risk of being damaged by this heating.

It also will be appreciated that, in general, the resilient elements 308 can bear directly on the upper faces of the power modules 110, with each resilient element 308 coming into contact with the upper face of the power module 110, or else can bear indirectly, through an intermediate part inserted between the resilient element 308 and the upper face of the power module 110. Furthermore, the terms "upper face" and "lower face" mean a face oriented substantially upward, respectively downward. In particular, the upper face of the power module 110 on which the flexible elements 308 bear can be any upwardly oriented face.

The attachments of the printed circuit board 306 and of the resilient elements 308 to the tops of the studs 302, 304 are implemented, for example, by means of screws respectively vertically screwed into the studs 302, 304.

The voltage converter 104 further comprises a cover 310 covering the printed circuit board 306.

A method 400 for manufacturing the voltage converter 104 of FIG. 3 will now be described with reference to FIG. 4.

During a step 402, the power modules 110 are placed in abutment against the spacers 210 present on the upper face of the heat sink 206. Thus, the lower faces of the power modules 110 extend opposite the upper face of the heat sink 206, with the thermal adhesive 212 inserted.

During a step 404, the resilient elements 308 are rigidly connected to the heat sink 206 so that each resilient element 308 comes into contact with the upper face of one of the power modules 110 and at least partly resiliently deforms in order to bear on this upper face in order to hold the power module 110 in place relative to the heat sink 206, in particular in order to hold it in abutment against the spacers 210. To this end, the resilient elements 308 are attached to the tops of the second studs 304.

During a step 406, the voltage converter 104 is heated so as to crosslink the thermal adhesive 212, while the resilient elements 308 bear on the upper faces of the power modules 110.

During a step 408, after heating, the printed circuit board 306 is attached to the tops of the first studs 302.

During a step 410, the pins 214 of the power modules 110 are connected to the printed circuit board 306.

Alternatively, the step 404 of rigidly connecting resilient elements 308 could be implemented after the step 406 of heating the thermal adhesive 212. In this case, during this heating step 406, a tool could be used to bear on the power modules 110 in order to hold them in place during heating.

Figure 5:
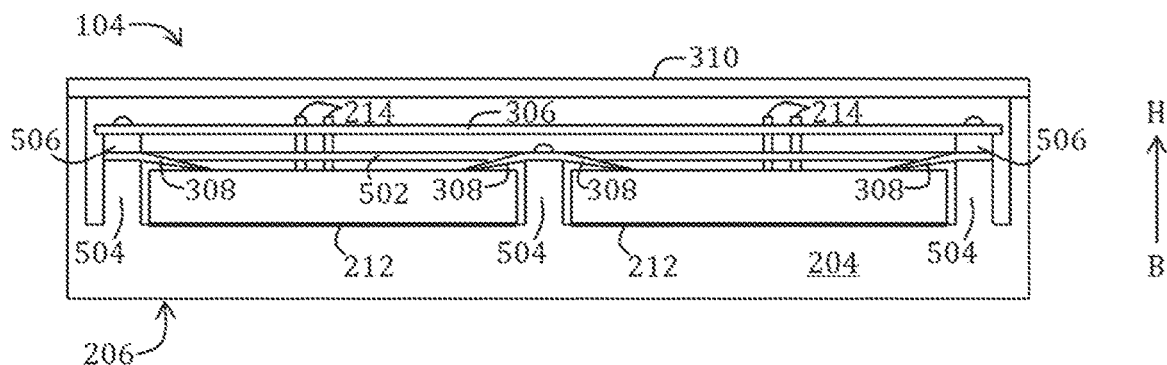
FIG. 5 is a section view of a voltage converter according to a second embodiment of the invention comprising the elements of FIG. 2.

FIG. 5 illustrates a second embodiment of the invention. This second embodiment is similar to the first embodiment of FIG. 3, except for the differences that will now be described.

In this second embodiment, the resilient elements 308 are formed as one part. More specifically, this part has a main substantially horizontal part 502 extending above the power modules 110, from which the resilient elements 308 project. Thus, the resilient elements are integrally formed with the main part 502. This part is, for example, made of metal, for example, of sheet metal.

Furthermore, the heat sink 206 comprises studs 504 projecting upward from the upper face of the plate 208 of the heat sink 206. The studs 504 are, for example, integrally formed with the plate 208 of the heat sink 206 so as to form a single part with said plate. The main part 502 is attached to the tops of these studs 504, so as to attach the resilient elements 308 to the heat sink 206. The attachment of the main part 502 to the tops of the studs 504 is implemented, for example, by means of screws respectively vertically screwed into the studs 504.

Furthermore, in the described example, for some studs 504, vertical extensions 506 are added to the main part 502 of the part, in line with these studs 504. The printed circuit board 306 is attached to the tops of these extensions 506, so as to extend above the main part 502 of the part. In a particular embodiment, the main part 502 of the part supporting the resilient elements 308 is screwed into the studs by means of column screws, i.e. the head of which is threaded. Thus, these screw heads form the extensions 506 and the printed circuit board 306 is attached by means of other screws screwed into the heads of the column screws.

It will be appreciated that, as for the first embodiment, the resilient elements 308 are attached to the heat sink 206 independently of the printed circuit board 306.

Figure 4:
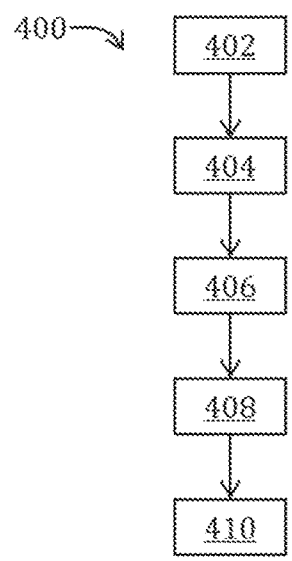
FIG. 4 is a block diagram illustrating the steps of a method for manufacturing a voltage converter, such as that of FIG. 3.

The voltage converter 104 of FIG. 5 can be manufactured by means of the method of FIG. 4.

Figure 6:
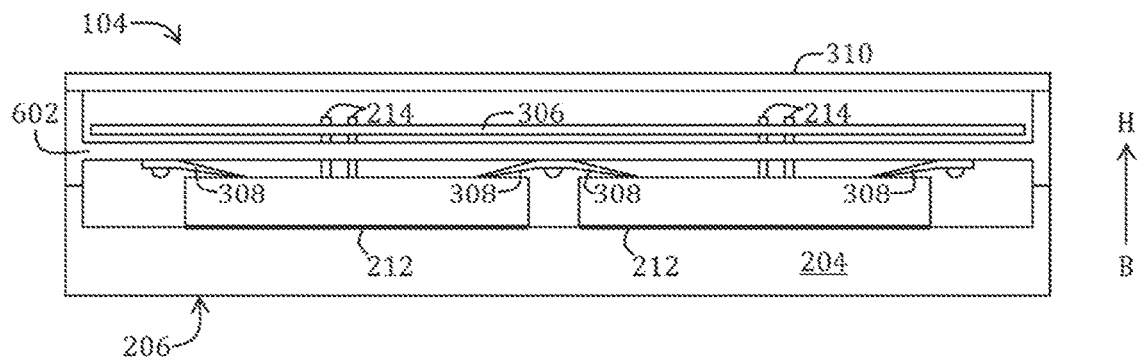
FIG. 6 is a section view of a voltage converter according to a third embodiment of the invention comprising the elements of FIG. 2.
Figure 7:
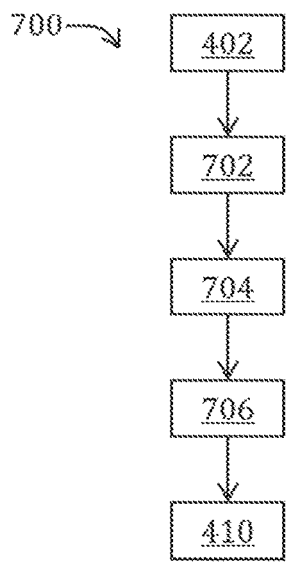
FIG. 7 is a block diagram illustrating the steps of a method for manufacturing a voltage converter, such as that of FIG. 6.

FIG. 6 illustrates a third embodiment of the invention. This third embodiment is similar to the first embodiment of FIG. 3, except for the differences that will now be described.

In this third embodiment, the voltage converter 104 further comprises a cover 602 covering the power modules 110 and attached to the heat sink 206, for example, by means of screws. The cover 602 is made of aluminum, for example.

The top of this cover 602 defines a housing for accommodating the printed circuit board 306.

The resilient elements 308 are attached to a lower face of the cover 602, for example, by riveting. In this case, downward projecting pins are provided on the lower face of the cover 602. A hole is provided in each part forming one or more resilient elements and a respective pin is inserted into a respective hole, then flattened.

This third embodiment has the advantage of not requiring a zone for attaching resilient elements to the heat sink 206, which saves space on the heat sink 206.

The voltage converter 104 of FIG. 6 can be manufactured by means of the method of FIG. 4. In this case, in step 404, the cover 602, with the resilient elements 308 (but without the printed circuit board 306), is added and attached to the heat sink 206. Furthermore, the printed circuit board 306 is attached to the cover 602 in step 408.

The present invention is not limited to the embodiments described above. Indeed, it will be obvious to a person skilled in the art that modifications can be made thereto.

In particular, the elements of the various embodiments that are technically compatible with each other can be combined.

Furthermore, the terms that are used should not be understood as being limited to the elements of the embodiments described above, but rather should be understood as covering all the equivalent elements that a person skilled in the art can infer from their general knowledge.

The invention claimed is:

1. A voltage converter comprising:
    a power module comprising at least one controllable switch configured to switch and to perform a voltage conversion;
    a heat sink, having an upper face opposite a lower face of the power module, configured to dissipate heat emitted by the power module, wherein the heat sink comprises at least one support projecting upward from the upper face of the heat sink; and
    at least one resilient element, bearing on an upper face of the power module, configured to hold the power module in place relative to the heat sink, wherein each resilient element is rigidly and directly connected to the heat sink, and wherein each resilient element is attached to a top of the at least one support.

2. The voltage converter as claimed in claim 1, further comprising a printed circuit board for controlling the power module.

3. The voltage converter as claimed in claim 1, wherein each resilient element is attached to a part covering the power module, said part being attached to the heat sink.

4. The voltage converter as claimed in claim 2, wherein the printed circuit board extends above a part covering the power module and is fixed to said part.

5. The voltage converter as claimed in claim 1, comprising a plurality of power modules and a part having a plurality of resilient elements respectively bearing on the upper faces of the power modules to hold said power modules in place relative to the heat sink.

6. The voltage converter as claimed in claim 1, comprising a plurality of power modules, wherein each one of the plurality of power modules has one or more resilient elements, and wherein the resilient elements are respectively bearing on the upper faces of the power modules to hold said power modules in place relative to the heat sink.

7. A method for manufacturing a voltage converter, comprising:
    placing a lower face of a power module comprising at least one controllable switch, which is configured to switch in order to perform a voltage conversion, opposite an upper face of a heat sink, which is configured to dissipate heat emitted by the power module, wherein the heat sink comprises at least one support projecting upward from the upper face of the heat sink; and
    rigidly and directly connecting at least one resilient element to the heat sink, so that the resilient element bears on an upper face of the power module to hold the power module in place relative to the heat sink; and
    attaching, each resilient element, to a top of the at least one support.

8. The method as claimed in claim 7, further comprising:
    inserting thermal adhesive between the lower face of the power module and the upper face of the heat sink; and
    after rigidly connecting each resilient element to the heat sink, heating the voltage converter so as to crosslink the thermal adhesive.

9. The method as claimed in claim 8, further comprising, after heating the voltage converter so as to crosslink the thermal adhesive, attaching a printed circuit board for controlling the power module to the heat sink.

10. The method as claimed in claim 7, further comprising:
    inserting thermal adhesive between the lower face of the power module and the upper face of the heat sink; and
    heating the voltage converter so as to crosslink the thermal adhesive,
    wherein the rigid connection of each resilient element to the heat sink is performed after the heating of the voltage converter.

* * * * *